(12) United States Patent
Suzuki

(10) Patent No.: US 7,952,981 B2
(45) Date of Patent: May 31, 2011

(54) SEMICONDUCTOR LASER DEVICE PROTECTION CIRCUIT, OPTICAL PICKUP APPARATUS, AND INFORMATION RECORDING/REPRODUCING APPARATUS

(75) Inventor: Hirofumi Suzuki, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 411 days.

(21) Appl. No.: 12/257,157

(22) Filed: Oct. 23, 2008

(65) Prior Publication Data

US 2009/0109831 A1    Apr. 30, 2009

(30) Foreign Application Priority Data

Oct. 25, 2007  (JP) .................................. 2007-278036

(51) Int. Cl.
    *G11B 7/00*    (2006.01)
(52) U.S. Cl. .................. 369/121; 361/91.1; 315/119
(58) Field of Classification Search .................. 369/121, 369/116, 53.26; 372/38.09, 38.02, 38.07; 361/57, 65, 88, 91.1; 315/125, 151, 291, 315/307, 308, 119, 129

See application file for complete search history.

(56) References Cited

U.S. PATENT DOCUMENTS

| | | | | |
|---|---|---|---|---|
| 7,207,325 | B2 * | 4/2007 | Ando | 123/618 |
| 7,491,584 | B2 * | 2/2009 | Yu et al. | 438/128 |
| 2003/0107324 | A1 | 6/2003 | Cho et al. | |
| 2009/0002050 | A1 * | 1/2009 | Chen | 327/333 |

FOREIGN PATENT DOCUMENTS

| | | |
|---|---|---|
| CN | 1423261 | 6/2003 |
| JP | 6-52018 | 7/1994 |
| JP | 2006-49549 A | 2/2006 |

* cited by examiner

*Primary Examiner* — Thang V Tran
(74) *Attorney, Agent, or Firm* — Morrison & Foerster LLP

(57) ABSTRACT

A semiconductor laser device has a cathode grounded and an anode connected to a collector of a transistor. The transistor has an emitter grounded and a base connected to a first external terminal via a first resistor. A digital transistor has a collector connected to the base of the transistor, an emitter grounded, and a base connected to a second external terminal via a resistor. When a voltage equal to or higher than the predetermined first voltage is applied to the base of the transistor, the transistor is put into a conducting state, and the semiconductor laser device is grounded via the transistor and thereby protected from static electricity and leak current.

9 Claims, 5 Drawing Sheets

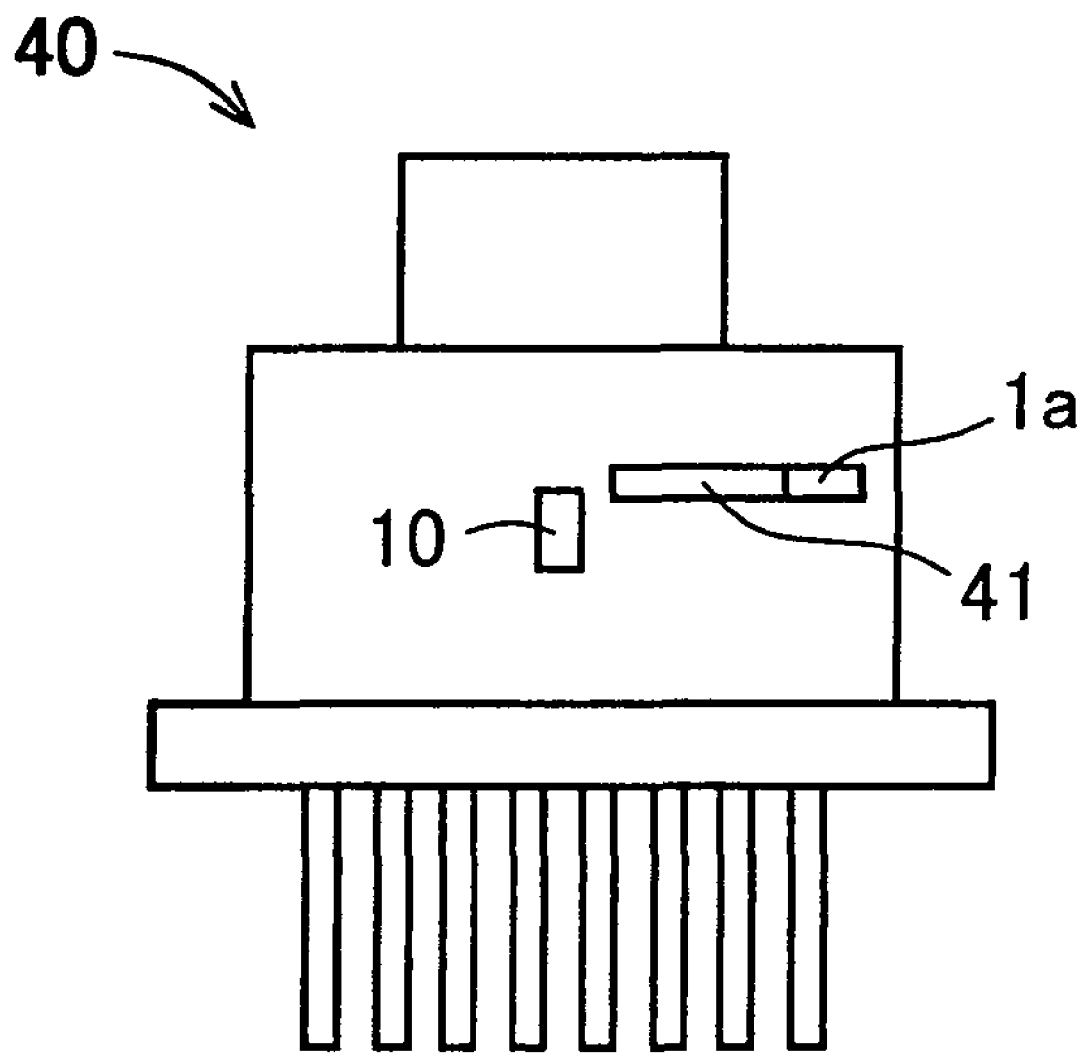

SEMICONDUCTOR LASER DEVICE PROTECTION CIRCUIT, OPTICAL PICKUP APPARATUS, AND INFORMATION RECORDING/REPRODUCING APPARATUS

CROSS-REFERENCE TO RELATED APPLICATION

This application claims priority to Japanese Patent Application No. 2007-278036, which was filed on Oct. 25, 2007, the contents of which are incorporated herein by reference in its entirety.

BACKGROUND OF THE INVENTION

1. Field of the Invention

The present invention relates to a semiconductor laser device protection circuit capable of protecting a semiconductor laser device from being broken by static electricity, and to an optical pickup apparatus and information recording/reproducing apparatus including the same. More particularly, the present invention relates to a semiconductor laser device protection circuit capable of protecting a semiconductor laser device that is used to record/reproduce information on a disk-shaped optical recording medium such as an optical disk or a magneto-optical disk from being broken by static electricity, and to an optical pickup apparatus and an information recording/reproducing apparatus which include the same.

2. Description of the Related Art

An optical pickup apparatus having a semiconductor laser device is used for an information recording/reproducing apparatus which records/reproduces information on an optical recording medium such as a compact disk (abbreviated as "CD") or a digital versatile disk (abbreviated as "DVD").

As a countermeasure against static electricity to protect the semiconductor laser device mounted in the optical pickup apparatus, the semiconductor laser device which is, for example, mounted on a substrate such as a flexible substrate or a hard substrate, has both terminals on the substrate directly connected to each other by soldering and thereby short-circuited. Owing to such a terminal-to-terminal short circuit of the semiconductor laser device, the semiconductor laser device can be protected from static electricity even when current generated by static electricity flows toward the semiconductor laser device. For achieving a short circuit between the both terminals of the semiconductor laser device, a technique has been developed that, for example, two short-circuiting patterns are formed in the optical pickup apparatus, and these two short-circuiting patterns are connected to the respective terminals of the semiconductor laser device while these two short-circuiting patterns are connected to each other by soldering.

In the above technique, it is necessary to perform a soldering work of the short-circuiting patterns in the stand-alone optical pickup apparatus, and to perform solder removal from the short-circuiting patterns upon incorporating the optical pickup apparatus into a recording/reproducing apparatus for optical recording medium. A problem may arise during the use of a soldering iron in the soldering work and solder removal because leak current may possibly flow through the semiconductor laser device due to a ground failure caused by the soldering iron.

In a semiconductor laser device protection circuit according to the technique disclosed by Japanese Unexamined Patent Publication JP-A 2006-49549, a semiconductor laser device is short-circuited by parallel connection of the semiconductor laser device with a chip resistor or a resistor made of an electrically-conductive material. The resistor connected in parallel to the semiconductor laser device protects the semiconductor laser device from static electricity. After completion of pickup adjustment, the connection with the chip resistor is cut in the case of using the chip resistor, or the electrically-conductive material is wiped or peeled off and thus removed in the case of using the electrically-conductive material, thereby bringing the semiconductor laser device out of the short-circuited state.

In the technique disclosed by JP-A 2006-49549, the resistor is used to protect the semiconductor laser device from the static electricity and therefore, the short-circuited state attributed to the resistor can be removed without using a soldering iron so that the flow of leak current can be avoided while there is another problem that after completion of pickup adjustment, a work is required for terminating the short-circuited state attributed to the resistor.

In the technique disclosed by Japanese Unexamined Utility Model Publication JP-U 6-52018 (1994), a laser diode protection circuit is connected to an anode of a laser diode in an optical information recording/reproducing apparatus. The laser diode protection circuit includes a transistor connected in parallel to the laser diode. Until a supply voltage being applied to the optical information recording/reproducing apparatus reaches such a supply voltage level that circuits other than the laser diode protection circuit normally operate, the transistor is energized to avoid current flow over the maximum rated value through the laser diode having its anode electrically grounded, so that the laser diode is prevented from breakage.

In the technique disclosed by JP-U 6-52018, although no current over the maximum rated value flows through the laser diode which can be thus prevented from breakage, there is a problem that electricity needs to be supplied also to the laser diode protection circuit and unless electricity is supplied to the optical pickup apparatus, the semiconductor laser device such as the laser diode cannot be protected.

SUMMARY OF THE INVENTION

An object of the invention is to provide a semiconductor laser device protection circuit which can protect a semiconductor laser device from static electricity and leak current and eliminate the need for releasing a short-circuited state, and to provide an optical pickup apparatus and information recording/reproducing apparatus including the same.

The invention provides a semiconductor laser device protection circuit for protecting a semiconductor laser device having two terminals, one of which is grounded, comprising:

a transistor connected to the other of the two terminals of the semiconductor laser device, when a voltage equal to or higher than a predetermined voltage being applied to the base, the transistor being put in a conducting state and letting the other terminal of the semiconductor laser device be grounded via the transistor, and when a voltage lower than the predetermined voltage being applied to the base, the transistor being put into a non-conducting state and letting the another terminal of the semiconductor laser device be opened.

Further, in the invention, it is preferable that the semiconductor laser device protection circuit further comprises:

a first resistor connected to the base; and a first external terminal connected to the first resistor, to which first external terminal is applied such a voltage that a voltage applied to the base is equal to or higher than the predetermined first voltage.

Further, in the invention, it is preferable that the semiconductor laser device protection circuit further comprises:

a second resistor having two terminals, one of which is connected to the other terminal of the semiconductor laser device;

a second external terminal connected to the other terminal of the second resistor; and a second transistor connected to the second external terminal, when a predetermined second voltage being applied to the second external terminal, the second transistor operating so that the base of the transistor is grounded via the second transistor and that voltage lower than the predetermined first voltage is applied to the base.

The invention provides an optical pickup apparatus using laser light to record or reproduce information on an optical recording medium, comprising:

the aforementioned semiconductor laser device protection circuit; and a semiconductor laser device emitting the laser light and connected to the semiconductor laser device protection circuit.

Further, in the invention, it is preferable that the optical pickup apparatus further comprises a conductive housing to which the semiconductor laser device protection circuit is grounded.

Further, in the invention, it is preferable that the semiconductor laser protection circuit is integrated therein.

Further, in the invention, it is preferable that the optical pickup apparatus further comprises a flexible substrate on which the semiconductor laser device protection circuit is mounted.

Further, in the invention, it is preferable that the optical pickup apparatus further comprises a rigid substrate on which the semiconductor laser device protection circuit is mounted.

There may be provided an optical module including:

a circuit in which the aforementioned semiconductor laser device protection circuit is integrated;

a semiconductor laser device to emit laser light, connected to the semiconductor laser device protection circuit; and a light-receiving element to receive the laser light.

There may be provided an optical pickup apparatus including the aforementioned optical module.

The invention provides an information recording/reproducing apparatus for recording or reproducing information on an optical recording medium using the aforementioned optical pickup apparatus.

According to the invention, the semiconductor laser device protection circuit for protecting a semiconductor laser device having two terminals, one of which is grounded, includes a transistor connected to the other terminal of the two terminals of the semiconductor laser device, and when a voltage equal to or higher than a predetermined voltage is applied to the base, the transistor is put into a conducting state and lets the other terminal of the semiconductor laser device be grounded. Furthermore, when a voltage lower than the predetermined voltage is applied to the base, the transistor is put into a non-conducting state and lets the other terminal of the semiconductor laser device be opened.

Accordingly, the short-circuited state can be removed by adjusting the voltage that is applied to the base, to be lower than the predetermined voltage, thereby excluding the work for removing the short-circuited state. Because of no need to use the soldering iron for removing the short-circuited state, it is also possible to avoid the leak current flow. Consequently, the semiconductor laser device can be improved in yield, and the semiconductor laser device mounted can be more reliable.

In addition, the productivity can also be increased since the work for removing the short-circuited state can be excluded.

The optical pickup apparatus may include the aforementioned optical module. In this case, there is no need to provide a space in which the semiconductor laser device protection circuit is mounted, separately, with the result that the optical pickup apparatus can be downsized.

According to the invention, the information recording/reproducing apparatus uses the aforementioned optical pickup apparatus to record or reproduce information on an optical recording medium, with the result that the information recording/reproducing apparatus itself is not required to take any measures against static electricity to protect the semiconductor laser device.

BRIEF DESCRIPTION OF THE DRAWINGS

Other and further objects, features, and advantages of the invention will be more explicit from the following detailed description taken with reference to the drawings wherein:

FIG. 3 is a flowchart for determining which state the electrical switching circuit is in;

FIG. 5 is a view showing one example of an overview of an optical module according to one embodiment of the invention.

DETAILED DESCRIPTION

Figure 1:
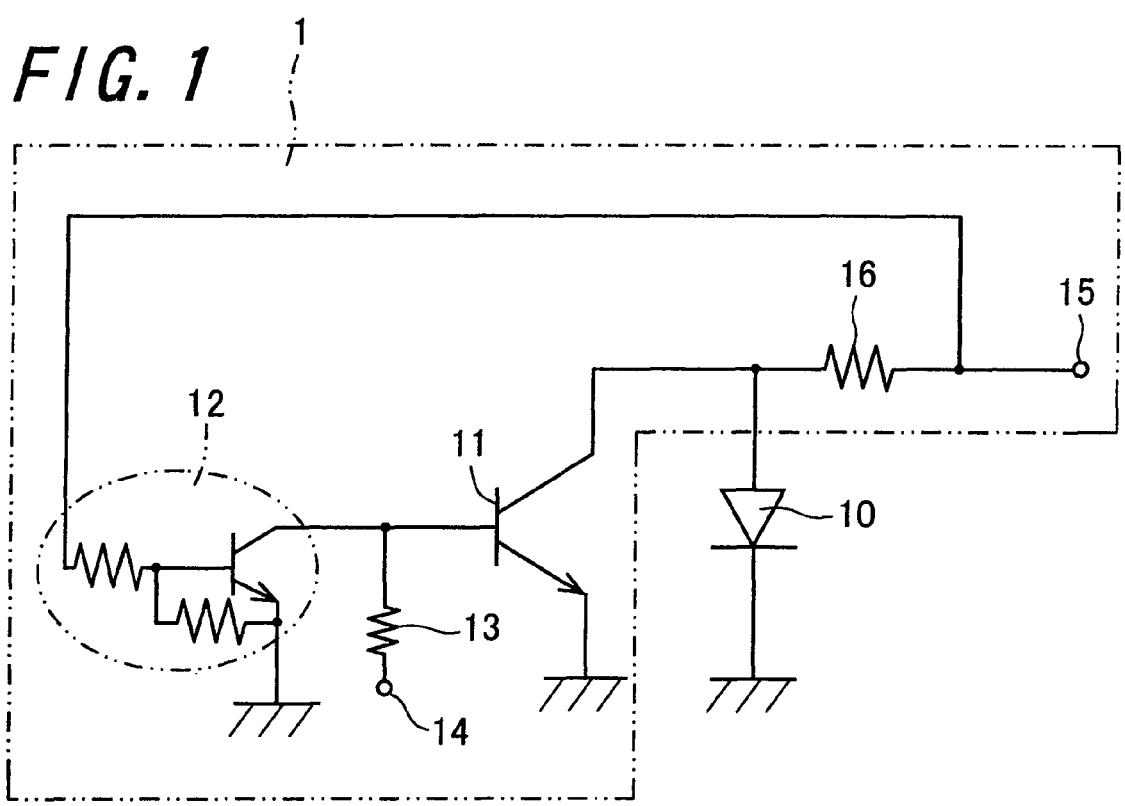
FIG. 1 is a view showing a configuration of an electrical switching circuit according to one embodiment of the invention.

Now referring to the drawings, preferred embodiments of the invention are described below.

FIG. 1 is a view showing a configuration of an electrical switching circuit 1 according to one embodiment of the invention. The electrical switching circuit 1 serving as a semiconductor laser device protection circuit includes a transistor 11, a digital transistor 12, a first resistor 13, a first external terminal 14, a second external terminal 15, and a second resistor 16.

A semiconductor laser device 10 is composed of a laser diode, for example. The semiconductor laser device 10 has a cathode grounded and an anode connected to the transistor 11. The transistor 11 serving as a transistor is an npn bipolar transistor and has a collector connected to the cathode of the semiconductor laser device 10, an emitter grounded, and a base connected to the first external terminal 14 via the first resistor 13. The first resistor 13 is composed of a carbon resistor, for example, and has resistance of 10 KΩ, for example.

The digital transistor 12 serving as the second transistor is composed of an npn transistor with a built-in resistor, for example. The digital transistor 12 has two resistors incorporated therein, one of which has resistance of 4.7 KΩ and is connected to a base and the other of which has resistance of 47 KΩ and is interposed in the connection between the base and an emitter. The digital transistor 12 has a collector connected to the base of the transistor 11, the emitter grounded, and the base connected to the second external terminal 15 via the resistor.

The second external terminal 15 is connected to the anode of the semiconductor laser device 10 via the second resistor 16. The second resistor 16 is a resistor for protecting the semiconductor laser device 10 from a voltage applied to the second external terminal 15. The second resistor 16 is composed of a carbon resistor, for example, and has resistance of 10 KΩ, for example.

No voltage application to the base of the transistor 11 sets the transistor 11 on OFF state, that is, to be in a non-conducting state, and current flows to the semiconductor laser device 10 via the second resistor 16 so that the semiconductor laser device 10 is switched on.

And then, a voltage is applied to the first external terminal 14. Depending on the voltage applied to the first external terminal 14, the transistor 11 is put into a conducting state when the voltage applied to the base of the transistor 11 is equal to or higher than a predetermined first voltage, for example, 1.0 volt (V). The semiconductor laser device 10 is therefore grounded via the transistor 11.

When the semiconductor laser device 10 is grounded via the transistor 11, the leak current flowing through the soldering iron or the current caused by static electricity is discharged via the transistor 11 so that the semiconductor laser device 10 can be prevented from breakage attributed to the leak current or static electricity.

And then, a voltage is applied to the second external terminal 15. When the voltage applied to the second external terminal 15 is equal to or higher than a predetermined second voltage, for example, 3 V, current flows to the base of the digital transistor 12 so that the digital transistor 12 is put into a conducting state. When the digital transistor 12 is put into a conducting state, the base of the transistor 11 is grounded via the digital transistor 12 so that the transistor 11 is put into a conducting state. When the transistor 11 is put into a non-conducting state, the semiconductor laser device 10 has its terminal opened and thus becomes operable.

As described above, the electrical switching circuit 1 serves as the semiconductor laser device protection circuit for protecting the semiconductor laser device 10 having two terminals, one of which is grounded, and includes the transistor 11 connected to the other terminal of the semiconductor laser device 10, which transistor 11 is put into a conducting state so that the other terminal of the semiconductor laser device 10 is grounded via the transistor 11 when the voltage equal to or higher than the predetermined voltage is applied to the base, and which transistor 11 is put into a non-conducting state so that the other terminal of the semiconductor laser device 10 is opened when the voltage lower than the predetermined voltage is applied to the base.

Accordingly, the short-circuited state can be removed by adjusting the voltage that is applied to the base, to be lower than the predetermined voltage, thus allowing for omission of the work for removing the short-circuited state. Because of no need to use the soldering iron for removing the short-circuited state, it is also possible to avoid the leak current flow. Consequently, the semiconductor laser device can be improved in yield, and the semiconductor laser device mounted can be more reliable. In addition, the productivity can also be increased since the work for removing the short-circuited state can be excluded.

The electrical switching circuit 1 further includes the first resistor 13 connected to the base, and the first external terminal 14 which is connected to the first resistor 13 and to which is applied such a voltage that the voltage applied to the base becomes equal to or higher than the first voltage. Accordingly, by changing the voltage applied to the first external terminal 14, it is possible to control the semiconductor laser device 10 to be grounded via the transistor 11 or to have its ground state removed.

The electrical switching circuit 1 further includes: the second resistor 16 having two terminals, one of which is connected to the other terminal of the semiconductor laser device 10; the second external terminal 15 connected to the other terminal of the second resistor 16; and the digital transistor 12 connected to the second external terminal 15. When the predetermined second voltage is applied to the second external terminal 15, the digital transistor 12 operates so that the base of the transistor 11 is grounded via the digital transistor 12 and that the voltage lower than the predetermined voltage is applied to the base. Consequently, even when the voltage is applied to the first external terminal 14 to ground the semiconductor laser device 10 via the transistor 11, the ground state can be removed by the voltage applied to the second external terminal 15.

Figure 2:
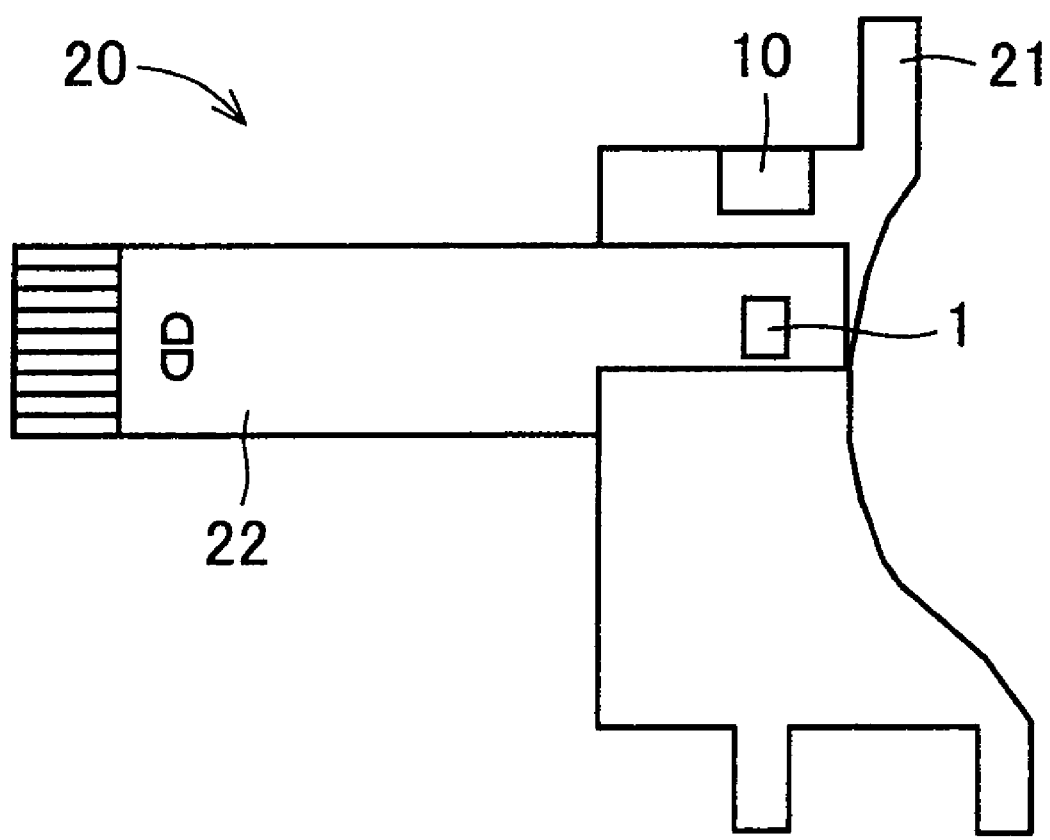
FIG. 2 is a view showing one example of an overview of an optical pickup apparatus according to one embodiment of the invention.

FIG. 2 is a view showing one example of an overview of an optical pickup apparatus 20 according to one embodiment of the invention. The optical pickup apparatus 20 is an apparatus which uses laser light to record or reproduce information on an optical recording medium, and includes the electrical switching circuit 1, the semiconductor laser device 10, a housing 21, and a flexible substrate 22.

The semiconductor laser device 10 is mounted on the housing 21 while the electrical switching circuit 1 is mounted on the flexible substrate 22. The anode of the semiconductor laser device 10 is connected to the collector of the transistor 11 in the electrical switching circuit 1. The electrical switching circuit 1 is grounded to the housing 21.

Since the electrical switching circuit 1 is thus mounted on the flexible substrate 22, there is no need to provide another substrate used only for the electrical switching circuit 1, allowing for downsizing of the optical pickup apparatus 20.

Figure 3:
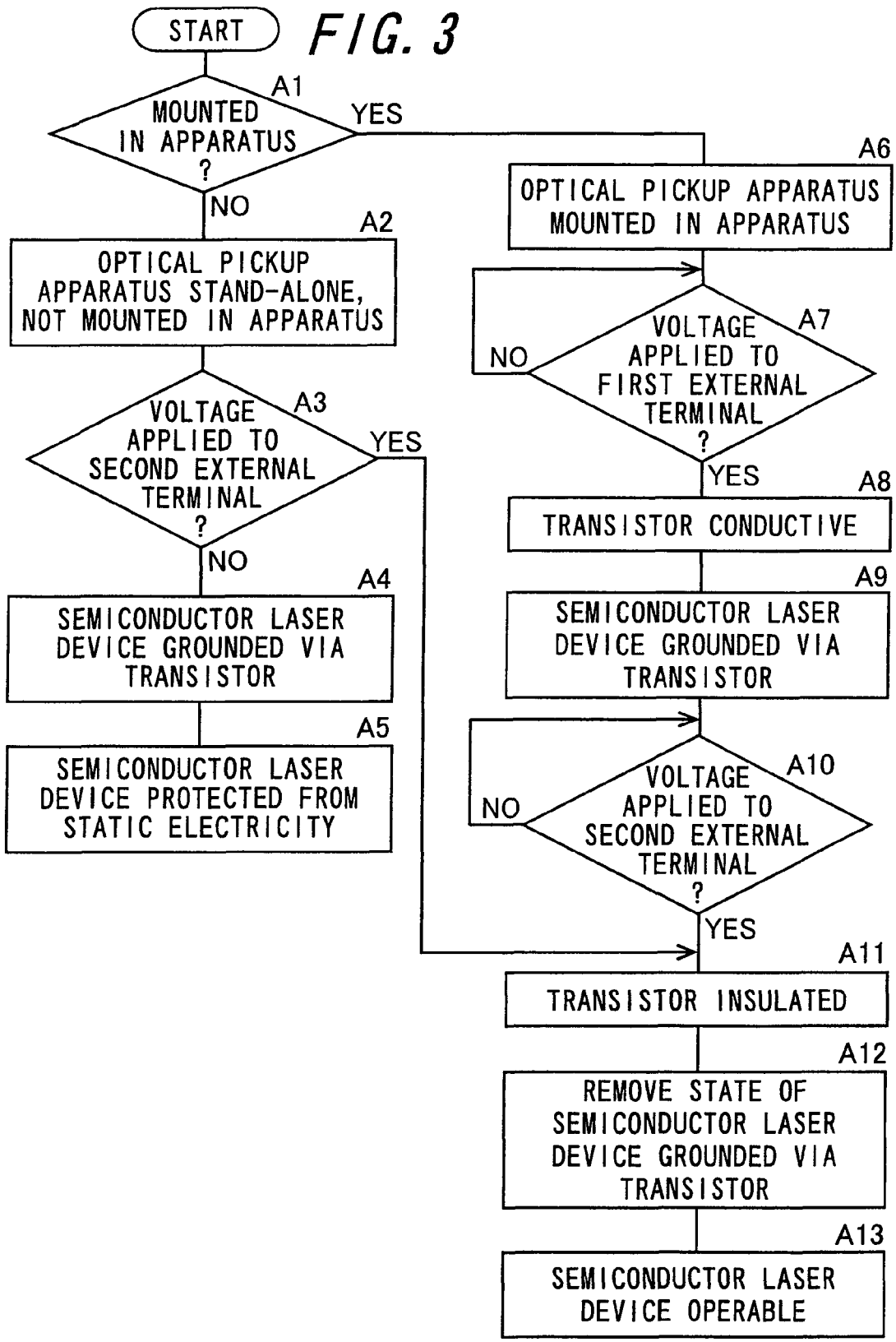

FIG. 3 is a flowchart for determining which state the electrical switching circuit 1 is in. In each step of the flowchart starting from Step A1, a current state or prospective state of the electrical switching circuit 1 can be determined.

In Step A1, it is determined whether or not the optical pickup apparatus 20 is mounted in the information recording/reproducing apparatus. Step A6 follows the determination that the optical pickup apparatus 20 is mounted in the information recording/reproducing apparatus, while Step A2 follows the determination that the optical pickup apparatus 20 is not mounted in the information recording/reproducing apparatus. In Step A2, the optical pickup apparatus 20 is standalone, that is, not mounted in the information recording/reproducing apparatus.

In Step A3, it is determined whether or not a voltage is applied to the second external terminal. When the voltage equal to or higher than the predetermined second voltage is applied to the second external terminal 15, the determination is made that a voltage is applied to the second external terminal, followed by Step A10. When the voltage lower than the predetermined second voltage is applied to the second external terminal 15, the determination is made that a voltage is not applied to the second external terminal, followed by Step A4. In Step A4, the semiconductor laser device 10 is grounded via the transistor 11. In Step A5, the semiconductor laser device 10 is protected from static electricity.

In Step A6, the optical pickup apparatus 20 is mounted in the information recording/reproducing apparatus. In Step A7, it is determined whether or not a voltage is applied to the first external terminal. When the voltage equal to or higher than the predetermined first voltage is applied to the base of the transistor 11 as induced by the voltage applied to the first external terminal 14, the determination is made that a voltage is applied to the first external terminal, followed by Step A8. When the voltage lower than the predetermined first voltage is applied to the base of the transistor 11 as induced by the voltage applied to the first external terminal 14, the determination is made that a voltage is not applied to the first external terminal, then returning to Step A7.

In Step A8, the transistor 11 is put into a conducting state. In Step A9, the semiconductor laser device 10 is grounded via the transistor 11 and protected from static electricity. In Step A10, it is determined whether or not a voltage is applied to the second external terminal. When the voltage equal to or higher than the predetermined second voltage is applied to the second external terminal 15, the determination is made that a voltage is applied to the second external terminal, followed by Step A11. When the voltage lower than the predetermined second voltage is applied to the second external terminal 15, the determination is made that a voltage is not applied to the second external terminal, returning to Step A10.

In Step A11, the digital transistor 12 operates so that the transistor 11 has its base grounded via the digital transistor 12 and thus is put into a non-conducting state. In Step A12, the ground state of the semiconductor laser device 10 via the transistor 11 is removed. In Step A13, the semiconductor laser device 10 becomes operable.

Figure 4:
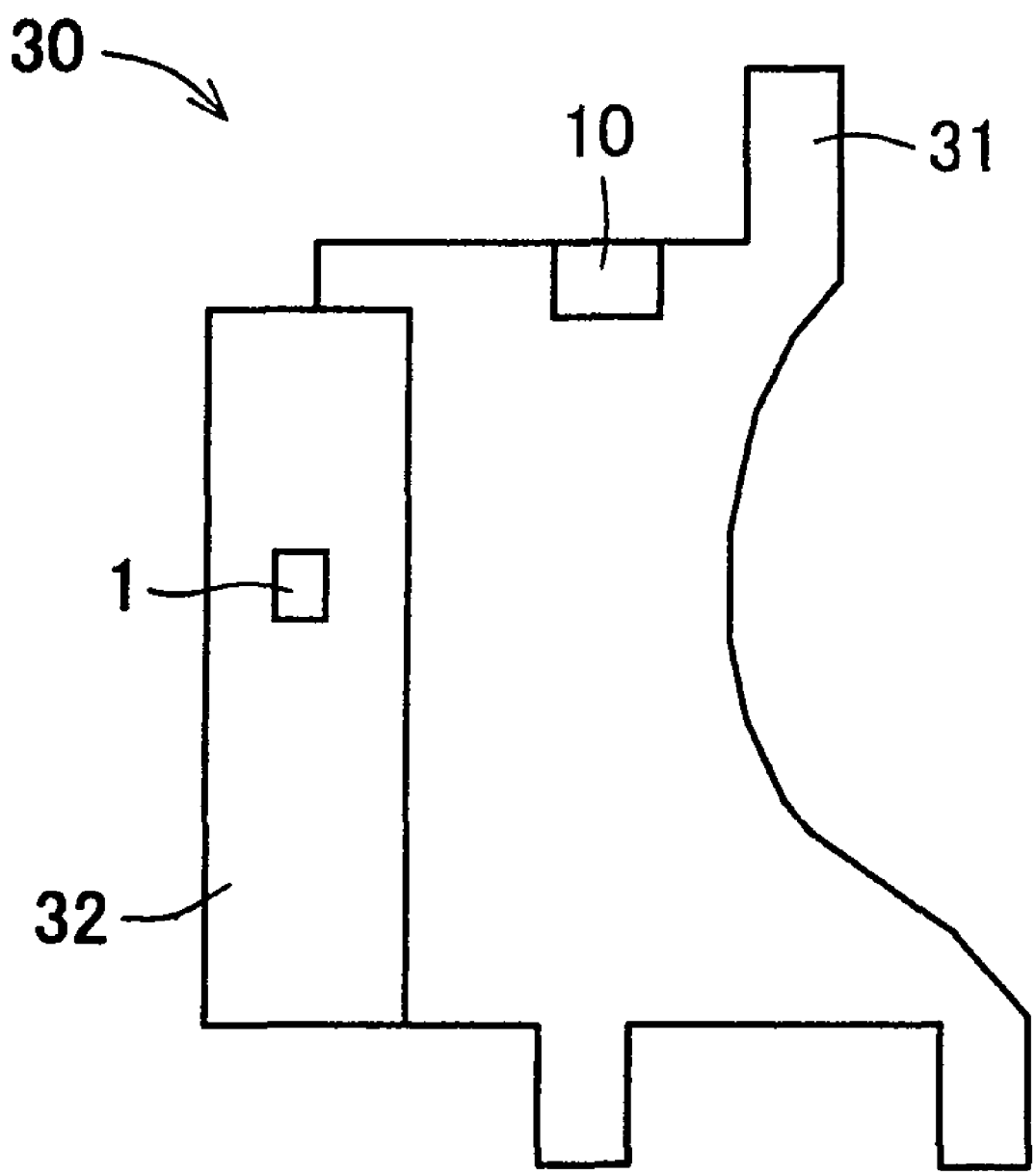
FIG. 4 is a view showing one example of an overview of an optical pickup apparatus according to another embodiment of the invention.

FIG. 4 is a view showing one example of an overview of an optical pickup apparatus 30 according to another embodiment of the invention. The optical pickup apparatus 30 is an apparatus which uses laser light to record or reproduce information on an optical recording medium, and includes the electrical switching circuit 1, the semiconductor laser device 10, a housing 31, and a rigid substrate 32. The rigid substrate 32 is not made of such a flexible base material as that used for the flexible substrate, but is a hard substrate made of an inflexible base material.

The semiconductor laser device 10 is mounted on the housing 31 while the electrical switching circuit 1 is mounted on the rigid substrate 32. The anode of the semiconductor laser device 10 is connected to the collector of the transistor 11 in the electrical switching circuit 1. The electrical switching circuit 1 is grounded via the housing 31.

Since the electrical switching circuit 1 is thus mounted on the rigid substrate 32, there is no need to provide another substrate used only for the electrical switching circuit 1, allowing for downsizing of the optical pickup apparatus 30.

Furthermore, the electrical switching circuit 1 is grounded to the housing 21, 31 and therefore, conducting state and non-conducting state of the transistor 11 can be controlled by using the voltage applied to the optical pickup apparatus 20, 30.

Although the electrical switching circuit 1 is constituted by connecting stand-alone resistors, transistor, and digital transistor to each other in the above embodiment, the resistors, transistor, and digital transistor may be integrated to thereby form an integrated circuit.

When the electrical switching circuit 1 is thus integrated, the optical pickup apparatus 20, 30 can be downsized.

FIG. 5 is a view showing one example of an overview of an optical module 40 according to one embodiment of the invention. The optical module 40 includes an electrical switching circuit 1a, the semiconductor laser device 10 which emits laser light, and a light-receiving element 41 which receives the laser light. The electrical switching circuit 1a is a circuit obtained by integrating the electrical switching circuit 1 shown in FIG. 1. The electrical switching circuit 1a has a circuit configuration that is the same as the circuit configuration of the electrical switching circuit 1 and therefore, will not be explained so as to avoid overlapping. The anode of the semiconductor laser device 10 is connected to the collector of the transistor 11 in the electrical switching circuit 1a.

As described above, the optical module 40 includes the electrical switching circuit 1a obtained by integrating the electrical switching circuit 1, and the optical module 40 emits laser light from the semiconductor laser device 10 connected to the electrical switching circuit 1a, and receives the laser light by the light-receiving element 41.

Although the electrical switching circuit 1 is mounted on the flexible substrate 22 or rigid substrate 32 in the above-described optical pickup apparatus 20, 30, the electrical switching circuit 1 may be replaced by the electrical switching circuit 1a by installing the optical module 40 in which the electrical switching circuit 1a is mounted.

Since the optical pickup apparatus thus includes the optical module 40, there is no need to provide a space in which the electrical switching circuit 1a is mounted, separately, allowing for downsizing of the optical pickup apparatus.

The optical pickup apparatus 20, 30 and the optical pickup apparatus using the optical module 40 are available for the information recording/reproducing apparatus which recodes or reproduce information on an optical recording medium such as a compact disk (abbreviated as "CD") or a digital versatile disk (abbreviated as "DVD").

As described above, the optical pickup apparatus 20, 30 or the optical pickup apparatus using the optical module 40 is used to record or reproduce the information on the optical recording medium in the information recording/reproducing apparatus, with the result that the information recording/reproducing apparatus itself is not required to take any measures against static electricity to protect the semiconductor laser device 10.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor laser device protection circuit for protecting a semiconductor laser device having two terminals, one of which is grounded, comprising:
   a transistor connected to the other of the two terminals of the semiconductor laser device having a predetermined first voltage applied to its base,
   when a voltage equal to or higher than the predetermined first voltage being applied to the base, the transistor being put in a conducting state and letting the other terminal of the semiconductor laser device be grounded via the transistor, and
   when a voltage lower than the predetermined first voltage being applied to the base, the transistor being put into a non-conducting state and letting the another terminal of the semiconductor laser device be opened.

2. The semiconductor laser device protection circuit of claim 1, further comprising:
   a first resistor connected to the base; and
   a first external terminal connected to the first resistor, to which first external terminal is applied such a voltage that a voltage applied to the base is equal to or higher than the predetermined first voltage.

3. The semiconductor laser device protection circuit of claim 2, further comprising:

a second resistor having two terminals, one of which is connected to the other terminal of the semiconductor laser device;

a second external terminal connected to the other terminal of the second resistor; and a second transistor connected to the second external terminal, when a predetermined second voltage being applied to the second external terminal, the second transistor operating so that the base of the transistor is grounded via the second transistor and that voltage lower than the predetermined first voltage is applied to the base.

4. An optical pickup apparatus using laser light to record or reproduce information on an optical recording medium, comprising:

the semiconductor laser device protection circuit of claim 1; and a semiconductor laser device emitting the laser light and connected to the semiconductor laser device protection circuit.

5. The optical pickup apparatus of claim 4, further comprising a conductive housing to which the semiconductor laser device protection circuit is grounded.

6. The optical pickup apparatus of claim 4, wherein the semiconductor laser protection circuit is integrated therein.

7. The optical pickup apparatus of claim 6, further comprising a flexible substrate on which the semiconductor laser device protection circuit is mounted.

8. The optical pickup apparatus of claim 6, further comprising a rigid substrate on which the semiconductor laser device protection circuit is mounted.

9. An information recording/reproducing apparatus for recording or reproducing information on an optical recording medium comprising the optical pickup apparatus of claim 4.

* * * * *